United States Patent [19]
Burns

[11] Patent Number: 5,051,956
[45] Date of Patent: Sep. 24, 1991

[54] MEMORY CELL HAVING MEANS FOR MAINTAINING THE GATE AND SUBSTRATE AT THE SAME POTENTIAL

[75] Inventor: Daniel Burns, Zurich, Switzerland

[73] Assignee: Hughes Microelectronics Limited, Glenrothes, United Kingdom

[21] Appl. No.: 327,639

[22] Filed: Mar. 23, 1989

[30] Foreign Application Priority Data

Mar. 25, 1988 [GB] United Kingdom ................ 8807225

[51] Int. Cl.$^5$ ........................ G11C 11/00; G11C 11/40
[52] U.S. Cl. .................................... 365/185; 365/154; 365/182; 365/228
[58] Field of Search ............... 365/185, 154, 182, 184, 365/156, 149, 189.09, 228; 307/238

[56] References Cited

U.S. PATENT DOCUMENTS

| | | | |
|---|---|---|---|
| 4,132,904 | 1/1979 | Harari | 365/185 |
| 4,236,231 | 11/1980 | Taylor | 365/205 |
| 4,313,106 | 1/1982 | Hsu | 365/182 |
| 4,333,166 | 6/1982 | Edwards | 365/182 |
| 4,342,101 | 7/1982 | Edwards | 365/185 |
| 4,348,745 | 9/1982 | Schmitz | 365/154 |
| 4,387,444 | 6/1983 | Edwards | 365/156 |
| 4,541,073 | 9/1985 | Brice et al. | 365/228 |
| 4,595,999 | 6/1986 | Betirac | 365/154 |
| 4,672,580 | 6/1987 | Yau et al. | 365/149 |
| 4,707,807 | 11/1987 | Cuppens et al. | 365/228 |

FOREIGN PATENT DOCUMENTS

2000407 6/1977 United Kingdom .

OTHER PUBLICATIONS

Lee, Douglas J., et al; "Control Logic and Cell Design for a 4K NVRAM;" IEEE Journal of Solid-State Circuits; vol. SC-18, No. 5, Oct. 1983; pp. 525-531.

Primary Examiner—Robert S. Tupper
Assistant Examiner—Alfonso Garcia
Attorney, Agent, or Firm—Terje Gudmestad; Jeannette M. Walder; Wanda K. Denson-Low

[57] ABSTRACT

A memory cell is provided comprising a bistable latch (I1, I2) having first and second nodes (NODE 1, NODE 2) and a nonvolatile transistor (NV1). The control gate of the nonvolatile transistor is connected to the first node and either the source or drain is connected to the second node. A switching transistor is provided for maintaining the control gate and the substrate of the nonvolatile transistor at substantially the same potential during volatile operation of the latch, thereby reducing voltage stress which would lead to charge tunnelling to or from the floating gate. In this way, disturbance of the floating gate charge is avoided during volatile operation. The cell is particularly suited to silicon gate fabrication technology.

5 Claims, 2 Drawing Sheets

MEMORY CELL HAVING MEANS FOR MAINTAINING THE GATE AND SUBSTRATE AT THE SAME POTENTIAL

This invention relates to a random access memory cell having nonvolatile characteristics, which is suitable for manufacture using silicon gate fabrication techniques.

Nonvolatile RAM cells which use floating gate tunnelling metal oxide semiconductor transistors are known, having the ability to store data in a volatile or nonvolatile manner. Examples of such cells, which are implemented in metal gate technology are shown in patent documents GB-A-2000407 and U.S. Pat. No. 4348745.

In metal gate technology, it is possible to place the tunnel oxide over a source or drain diffusion in the floating gate transistor, or within the channel area The physical position of the tunnel oxide has serious implications for device application. When used in its final application, the nonvolatile device may be expected to endure 1 million write/erase cycles, or retain a single programmed event for 10 years. Simultaneously, there is no limitation on the number of times the device may be read. Obviously in a period of 10 years, the memory element may be read many millions of times, and it is therefore important that during the reading action, there is no disturbance of floating gate charge. In known devices, the action of reading the cell (irrespective of whether the read action is reading of volatile or nonvolatile data) causes a surge of current to pass through the nonvolatile device If the tunnel is located over the drain diffusion or in the channel, this current surge causes an instantaneous voltage pulse which stresses the tunnel oxide This limits the endurance of the cell. For this reason, in known devices implemented in metal gate technology, the tunnel is generally placed over the source diffusion, which is fixed to the negative voltage supply line during read operations.

Silicon gate technology offers significant advantages over metal gate technology in terms of density, speed and fabrication cost. One of the advantages of the silicon gate process is the self-aligning nature of the sequence of fabrication steps Overlying gate regions can act as masks for subsequent doping of the underlying substrate. In this manner, overlap of a gate and a doped region of substrate can be advantageously avoided As a consequence of this feature of the process, an oxide tunnel cannot easily be placed over a drain diffusion. To fabricate a nonvolatile floating gate transistor using the silicon gate process, it is preferable to place the tunnel over the channel substrate.

An example of a known nonvolatile RAM cell incorporating a floating gate transistor which can be fabricated using the silicon gate process is shown in I.E.E.E Journal of Solid-State Circuits, Vol. SC18, No. 5, October 1983, pages 525 to 531. The cell described in this document does not control the source/drain terminals of the nonvolatile transistor, leaving these nodes floating. This can, after a period of time, lead to deterioration of the data stored in the nonvolatile transistor during continued operation of the cell in a volatile mode.

The present invention seeks to provide an improved nonvolatile RAM cell, which is suitable for silicon gate implementation.

According to the present invention, there is provided a memory cell comprising a bistable latch having first and second nodes and a nonvolatile transistor having a source, a drain and a control gate, the control gate being connected to the first node and one of the source and drain being connected to the second node; the nonvolatile transistor further having a substrate and a floating gate between the control gate and the substrate and means being provided for maintaining the control gate and the substrate at substantially the same potential during volatile operation of the bistable latch. Nonvolatile influence from the nonvolatile transistor is absent during volatile operation of the bistable latch.

Since means are provided for maintaining the control gate and the substrate at substantially the same potential during volatile reading and writing, there is no significant voltage stress across the tunnel when a tunnel is provided between the floating gate and the substrate. For this reason, there is little or no disturbance of the floating gate charge The substrate may be connected to the source of the nonvolatile transistor, in which case the said means may be a transistor between the control gate and the source.

It is preferred that the cell is arranged such that when the bistable latch is in a first state and charge is allowed to transfer to or from the floating gate, then upon subsequent influence from the nonvolatile transistor on the second node, the bistable latch adopts the first state, irrespective of the state it is in immediately prior to said influence. In this manner, inversion of data upon nonvolatile read-back is avoided A write operation is performed by setting the latch to a particular state, and charging or discharging the floating gate in accordance with that state. The cell may then be used in a volatile manner, and eventually, when a nonvolatile read operation is carried out, the nonvolatile transistor toggles the cell to the original state. In the case where the nonvolatile transistor has a channel of N-type semiconductor the non-inversion of data upon read-back can be achieved by arranging for the nonvolatile transistor to connect the second node with a source of positive voltage.

A switching transistor may be provided between the first node and the control gate of the nonvolatile transistor. Such a switching transistor serves to connect the first node to the control gate only when a nonvolatile write operation is to be performed When the switching transistor is on, the potential difference between the nodes of the latch appears across the tunnel between the substrate and control gate of the nonvolatile transistor. By reducing the potential of the negative supply (or increasing the potential of the positive supply), this potential across the tunnel allows charge transfer between the substrate and the floating gate.

Where such a switching transistor is included, a problem can exist in that the voltage achieved at the control gate may be degraded vis-a-vis the voltage on the node to which it is switched For example, if the switching transistor is P-type and is required to transmit a voltage equal to the negative supply voltage to the control gate, the pull-down voltage achieved will be degraded by a PMOS threshold voltage and a body bias effect. To address this problem, means may be provided for supplying a voltage lying outside the voltage supply of the bistable latch to the gate of the switching transistor. In the case where the switching transistor has a channel of P-type semiconductor, the said voltage supplied to the gate may be more negative than the negative supply to the bistable latch.

Preferably the bistable latch comprises two inverters driving the two nodes, wherein means are provided for switching off the inverter driving the second node, so as to allow that node to float. In this manner, a cell is constructed requiring only one nonvolatile transistor. This is particularly advantageous because in the actual construction of the circuit, it is necessary to duplicate the nonvolatile transistor to provide a degree of redundancy, in case of failure. Thus, the nonvolatile transistor occupies substantially more space than a normal transistor.

The means for maintaining the control gate and the substrate at substantially the same potential may comprise P-and N-channel transistors in parallel, arranged to be driven by complementary signals supplied to their gates. This is advantageous because N-channel transistors are better for transmitting a negative voltage, and P-channel transistors are better for transmitting a positive voltage.

Although the circuit could be implemented in metal gate technology, it is particularly suitable for fabrication using a silicon gate process, and accordingly it is preferred that the nonvolatile transistor has a tunnel region between the floating gate and a channel formed in the substrate, for transfer of charge to and from the floating gate (e.g.) by Fowler-Nordheim tunnelling).

According to a further aspect of the invention, a method of reading of nonvolatile data from a memory cell as described above is provided, comprising the steps of setting the bistable latch to a predetermined state, allowing the second node to float at a first potential and connecting the nonvolatile transistor into the circuit, whereby, depending only on the charge stored on the floating gate, if the nonvolatile transistor is in a conducting state, the second node is driven by the nonvolitile transistor to a second potential, whereas, if the nonvolatile transistor is in a nonconducting state, the second node remains at the first potential.

The memory cell according to the invention has the following advantages over prior art cells:

(i) Static RAM volatile operation
(ii) Single action programming for the whole array
(iii) No inversion of data on read-back
(iv) Option of volatile RAM operation without nonvolatile data corruption
(v) No read disturb In use, the circuit is for example arranged such that in the event of mains power failure, DC power is maintained for just long enough to allow all the data in the volatile latches of the memory array to be written into the nonvolatile transistors, so that upon subsequent restoration of AC power, the original data can be retrieved into the volatile latches. There are, however, many other situations where a nonvolatile operation of the array could be carried out.

A preferred embodiment of the present invention will now be described, by way of example, with reference to the drawing, in which.

Figure 1:
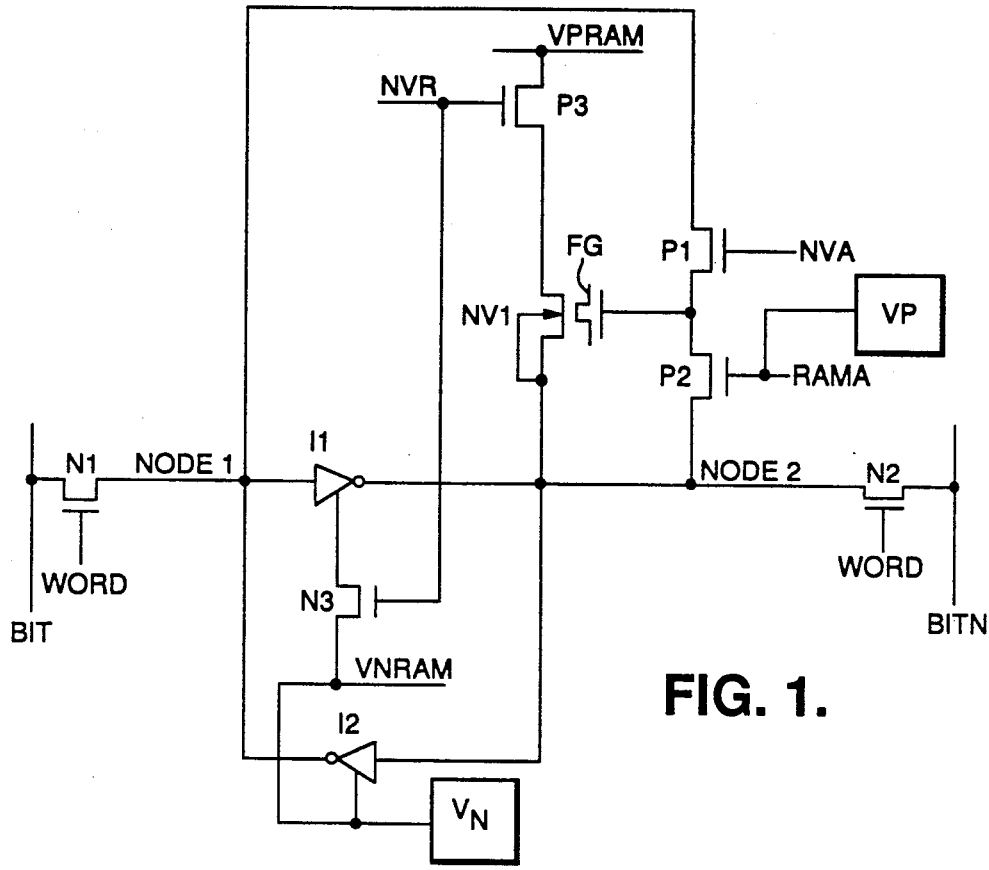
FIG. 1 shows the circuit diagram of the preferred embodiment of the invention.

Referring to FIG. 1, the circuit comprises a RAM latch consisting of two back-to-back inverters I1 and I2. The inverters are formed in a manner standard in the art. The latch is accessible via two pass transistors N1 and N2, which allow the latch to be both established and interrogated via data lines BIT and BITN. At the inputs of inverters I1 and I2, there are nodes NODE 1 and NODE 2 respectively.

The requirement for nonvolatility has been met by incorporating a specially fabricated transistor NV1, capable of Fowler-Nordheim tunnelling. This transistor has a floating gate FG, with a tunnelling region between the gate and substrate of the transistor The substrate and source are connected together The source of the nonvolatile transistor NV1 is connected to node 2 The drain is connected via transistor P3 to the positive voltage supply VPRAM. The gate of transistor P3 connects with the nonvolatile read control line NVR, which also controls the gate of a further transistor N3, connected between inverter I1 and negative supply line VNRAM. The gate of the nonvolatile transistor NV1 is effectively connected to node 1 via transistor P1 The gate of transistor P1 connects with nonvolatile activate line NVA. A further transistor, P2 is connected between the gate of NV1 and node 2, the gate of P2 being connected to RAM-activate control line RAMA.

The transistors N1, N2 and N3 are all N-type, and the transistors P1, P2 and P3 are all P-type. The supply potential at VPRAM may be between 3 and 7 volts, for example 5 volts.

The operation of the cell is as follows.

When there is no activity to either program or read the memory, the control signals NVR and NVA are held at logic high and the control lines RAMA and WORD are held at logic low. The BIT and BITN lines are used to interface the memory cell to the input/output data bus of the integrated circuit.

To input data, BIT and BITN are held at opposite logic conditions and the address line WORD is taken from a default logic low to a logic high This transition of WORD switches on transistors N1 and N2 and allows the logic states held on the BIT and BITN lines to become established on node 1 and node 2 respectively This in turn sets the latch formed by the two inverters I1 and I2. The inverters must not, of course, be able to resist the influence of the devices driving BIT and BITN.

If the address line WORD is now returned to the logic low condition the bistable latch retains the digital information formerly stored on the BIT and BITN lines. These lines can now be used to input data to another memory address defined by another WORD line. The action described is a volatile memory program operation; if the power supply to the circuit is denied the information contained in the memory cell will be lost.

To perform a volatile memory read the BIT and BITN lines are both precharged to approximately half supply voltage and then released to an undriven condition The address line WORD is taken to logic high and the condition of the bistable latch is superimposed on the BIT and BITN lines. The WORD line is then lowered and the procedure can be repeated for the next address.

During the above volatile operation, transistor P1 is switched off and transistor P2 maintains the gate of nonvolatile transistor NV1 at approximately the same potential as its source. Thus, there is no significant potential difference across the floating gate FG of the nonvolatile transistor Any charge on the floating gate is therefore preserved and protected from influence by the volatile operation of the cell.

To program the nonvolatile transistor NV1, whether by erasing data stored therein or writing data thereto, it is necessary to provide an increased voltage between the source and gate of the transistor, a suitable voltage being 13 volts. This increased voltage is achieved by "pumping" the negative supply rail VNRAM 8 volts below its normal potential A programming step is then as follows.

To erase the nonvolatile transistor, data is established in the bistable latch such that node 1 is a logical low and node 2 is a logical high The NVA and RAMA signals are then simultaneously switched from their default logic level to logic low and logic high respectively, causing transistor P1 to conduct and transistor P2 to switch off. The voltage at node 1 is thereby transmitted to the control gate (the voltage at node 2 being present at the source/well terminal of NV1). At this point, VNRAM undergoes a proprietary modulation, causing its potential to drop through 8 volts The potential of the node 1 drops a corresponding amount, and this voltage (less the drain-to-source drop across P1) appears between the source and gate of nonvolatile transistor NV1. This causes charge to be placed on the isolated floating gate of the nonvolatile transistor by a process of Fowler-Nordheim tunnelling. The mechanism causes the nonvolatile transistor to experience a threshold shift, causing it to behave as a depletion device.

By inverting the data in the bistable latch and repeating the VNRAM modulation, a charge of opposite polarity is placed on the floating gate, causing an opposite threshold shift, resulting in an increased condition of enhancement of the nonvolatile transistor.

Having either written or erased the nonvolatile transistor, the power to the circuit can be denied and the data programmed will be available upon subsequent application of supply voltage.

The actions required to read the nonvolatile data are as follows:

The control signals NVA, RAMA and WORD are held at their default conditions (high, low and low respectively). The BIT and BITN lines are established to a condition of logic high and logic low respectively and the WORD line is then momentarily pulsed low, to superimpose the BIT line conditions on node 1 and node 2 The NVR control line is then taken to a logic low which acts to connect the nonvolatile transistor NV1 to the positive supply line VPRAM, and denies the negative supply VNRAM from inverter I1. This modification to the negative supply of the bistable latch (removal of the negative supply from inverter I1) is a feature that distinguishes this latch from a standard RAM arrangement.

The conditions now reached in the cell mean that node 2 is floating at zero potential. Whether node 2 remains at that potential, or rises to a logic high, depends on the condition of the nonvolatile transistor. If the nonvolatile transistor has been erased into the depletion condition, node 2 is pulled to a high voltage level, thus toggling the condition of the latch If, on the other hand, the nonvolatile device is in an enhancement mode (and noting that device P2 is in the default state of connecting the control gate to node 2, thus denying gate drive), then node 2 will not rise in voltage, and the latch will remain in its established state. It is to be noted that it is also this default action of P2 that short circuits the sensitive terminals of the nonvolatile transistor during volatile RAM action, and prevents nonvolatile data corruption during operation in this mode.

It should also be noted that to erase a nonvolatile memory cell, node 1 is required to be a logic low and node 2 a logic high; this is the same state as is achieved from nonvolatile read of an erased device Thus the data does not suffer inversion upon read-back.

Reference has been made to the modification of the negative supply of the bistable latch This has the further advantage of limiting the supply current during the nonvolatile read operation.

Whereas the use of PMOS transistors to transmit pull-down voltages from node 1 and node 2 to the gate of the nonvolatile transistor could be a source of difficulty because the pull-down voltage achieved is degraded by a PMOS threshold voltage and a body bias effect in P1 or P2, such a difficulty is overcome by pumping the NVA and RAMA signals approximately two PMOS threshold voltages below the VNRAM. This counteracts the voltage degradation introduced by the PMOS transistors, when acting as pull-down devices. This feature makes use of the "pump" which is required to provide the increased gate-to-source voltage required for programming the nonvolatile transistor. The need to pump signals NVA and RAMA does not therefore over-complicate the circuit. Degradation due to body bias effects are minimised by using PMOS transistors and are therefore easier to compensate for.

The circuit described with reference to FIG. 1 has a limitation, which is addressed by the circuit of FIG. 2. The draw-back is the current consumption necessary to drive the signals RAMA and NVA by voltages more negative than VNRAM, when they are at logic low. While in the circuit of FIG. 1, driving these signals by an increased negative voltage is facilitated by the fact that a voltage pump is in any case necessary for programming the nonvolatile transistor, the need to operate the voltage pump for driving NVA and RAMA in addition to VNRAM increases the current consumption This is particularly so in the case of the RAMA signal, since this signal is maintained low throughout RAM operation (i.e. virtually all the time). In that case, the pumped negative voltage represents a permanent current consumption requirement, even if the rest of the integrated circuit is inactive.

Figure 2:
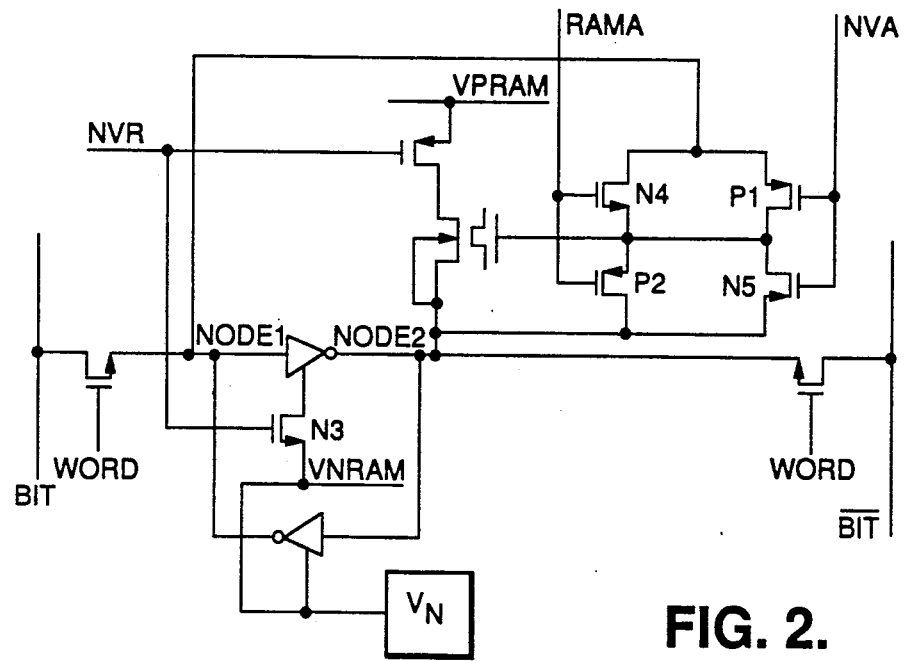
FIG. 2 shows the circuit of FIG. 1, with certain improvements.
Figure 3:
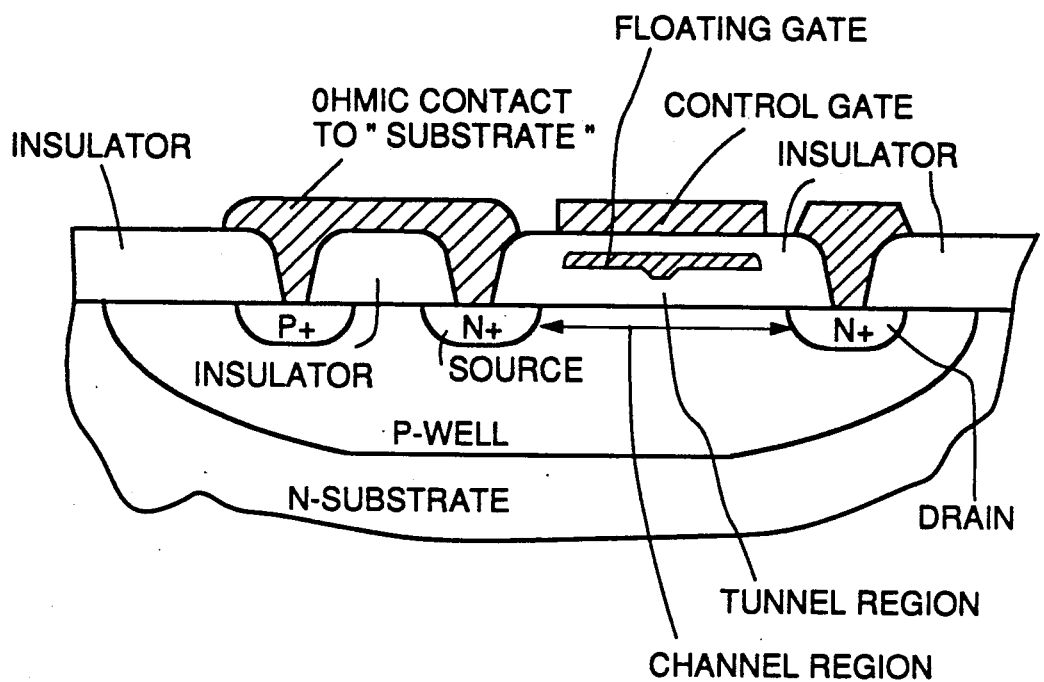
FIG. 3 shows a cross-section of a non-volatile transistor in which the source is connected to the substrate (P-well).

The circuit of FIG. 2 overcomes this limitation by including two further N-type transistors N4 and N5. These transistors are placed in parallel with transistors P1 and P2 respectively The gate of N4 is connected to RAMA and the gate of N5 is connected to NVA. In this embodiment, the signals RAMA and NVA must be complementary and non-overlapping.

In the operation of this circuit, during RAM operation, RAMA is held low and NVA high, whereby P2 and N5 provide parallel paths connecting the gate of NV1 to its source. Thus, when node 2 is low, P2 does not have to pull down the potential of the gate of NV1 (for which a P-type transistor is ill suited), but this is more effectively done by transistor N5 Conversely, however, when node 2 is high, the gate of NV1 can readily be pulled high by transistor P2 Similarly, during nonvolatile operation, NVA is low and RAMA is high, whereby P1 and N4 conduct. In this way, both a P-type and N-type channels are provided between the gate of NV1 and node 1.

Since both signals RAMA and NVA are turning on one transistor and turning off another, it is important that they do not overlap (i.e. RAMA and NVA must switch simultaneously from one logic state to the other). To ensure that problems do not arise at the point of change over, when there exists a possibility of causing a short between each side of the latch, P1 and N4 can be made long-channel in relation to the devices in inverter 12.

As has been explained, the need to pump RAMA in the circuit of FIG. 1 creates a greater drain on current than the need to pump NVA. For this reason, the inclusion of transistor N5 in the circuit of FIG. 2 is of greater importance than the transistor N4. In an alternative embodiment, therefore, transistor N4 is omitted and line NVA is pumped negative whenever P1 is to conduct and a nonvolatile operation is to be made The omission of transistor N4, of course, reduces the chip area occupied by the cell.

It will, of course, be understood that the above description has been given by way of example only, and that modifications of detail can be made within the scope of the invention.

What is claimed is:

1. A memory cell, comprising:
    a bistable latch having first and second nodes;
    a nonvolatile transistor having a source, a drain, a control gate, a substrate and a floating gate between the control gate and the substrate, wherein the substrate is electrically connected to the source;
    a switching transistor for enabling the control gate during a nonvolatile write operation, wherein the switching transistor is electrically coupled between the control gate and the first node and the second node is electrically coupled to the source; and
    means for maintaining the control gate and the substrate at approximately the same potential during volatile operation of the bistable latch, said means comprising a transistor and being electrically coupled between the control gate and the substrate, wherein during volatile operation of the bistable latch the switching transistor is off and the maintaining means transistor is on.

2. The memory cell of claim 1 wherein the switching transistor is formed of P-type semiconductor and wherein the maintaining means transistor is formed of P-type semiconductor.

3. The memory cell of claim 1 wherein the switching transistor comprises a P-type transistor and an N-type transistor in parallel and the maintaining means comprises a P-type transistor and an N-type transistor in parallel, said transistors each having a gate and said P- and N-type transistors being driven by complementary signals to their gates.

4. The memory cell of claim 1 wherein the bistable latch comprises first and second inverters driving said second and first nodes respectively, each inverter having a negative supply voltage, and further comprising means for switching off said first inverter from its supply voltage, said means being coupled between the first inverter and its negative supply voltage.

5. The memory cell of claim 1 wherein said nonvolatile transistor includes a channel region in the substrate and a tunnel region between the floating gate and the channel, whereby charge may be transferred between the substrate and the floating gate by Fowler-Nordheim tunnelling.

* * * * *